(12) United States Patent
Chang

(10) Patent No.: US 7,190,595 B2
(45) Date of Patent: Mar. 13, 2007

(54) PROTECTING DEVICE OF A MEMORY MODULE

(76) Inventor: Wan Chien Chang, 235 Chung-Ho, Box 8-24, Taipei (TW)

( * ) Notice: Subject to any disclaimer, the term of this patent is extended or adjusted under 35 U.S.C. 154(b) by 260 days.

(21) Appl. No.: 10/946,093

(22) Filed: Sep. 22, 2004

(65) Prior Publication Data

US 2006/0061975 A1     Mar. 23, 2006

(51) Int. Cl.
*H05K 9/00*     (2006.01)
(52) U.S. Cl. ....................... 361/816; 361/818; 361/800
(58) Field of Classification Search ................ 361/799, 361/728, 801, 736, 759, 737, 727, 800
See application file for complete search history.

(56) References Cited

U.S. PATENT DOCUMENTS 6,116,950 A * 9/2000 Koseki ................ 439/541.5
6,166,913 A * 12/2000 Fun et al. ................ 361/737
6,297,966 B1 * 10/2001 Lee et al. ................ 361/799

\* cited by examiner

*Primary Examiner*—Tuan Dinh
*Assistant Examiner*—Hung S. Bui

(57) ABSTRACT

A protecting device of a memory module comprises two protecting sheets capable of covering a memory. Each upper edge of the protecting sheet has a buckling sheet and a buckling seat. One buckling sheet of one protecting sheet is capable of being buckled to the buckling seat of another protecting sheet. A front edge of each buckling seat is lowered so as to form an upper section surface and a lower section surface. The buckling hole has a lower buckling hole in the lower section surface and an upper buckling hole at the upper section surface. A front edge of the buckling sheet is lowered so as to form an upper section surface and a lower section surface. The lower section surface of the buckling sheet is formed with a buckling piece; and the buckling piece is extended with at least one tenon.

10 Claims, 12 Drawing Sheets

PROTECTING DEVICE OF A MEMORY MODULE

FIELD OF THE INVENTION

The present invention relates to memory modules, and particular to a protecting device of a memory module, wherein a pair of protecting sheets are used to protect a chip of the memory so as to protect the memory from collision and crack.

BACKGROUND OF THE INVENTION

In the memory arrangement, two banks of chips are arranged at two sides of a printed circuit board. The chips are protected by a pair of protecting sheets for preventing from collision and crack. The protecting sheets are made of metal material and buffer material of the protecting sheets is heat conductive material so as to have protection and heat dissipation effect.

In the prior art, the two protecting sheets are locked by screws or rivets. Since the assembly work is difficult, U shape clips are designed to assemble the protecting sheets. In one prior art, upper ends of the heat dissipating sheets are installed with buckling hooks or buckling holes for buckling two heat dissipating sheets. Then memory is adhered to the protecting sheets by heat conductive glues. Meanwhile, outer sides of the heat dissipating sheets are installed with clips. The hooks of clips and buckling holes of heat dissipating sheet are used to firmly secure the structure.

Since the hooks of the heat dissipating sheets have sheet like structures with an identical width. The buckling holes are slightly larger than the rectangular holes of the hooks so that in buckling, the two heat dissipating sheets easily fall out so that the memory is difficult to be adhered to the protecting sheets. Especially, after secured, the heat dissipating sheets easily move toward two sides so that the memory therein is separated therefrom. If the states occur frequently, the chips will be destroyed. Next, the prior art clips have a U shape. After the hook is assembled with the buckling holes, it is difficult to detach the clips.

SUMMARY OF THE INVENTION

Accordingly, the primary object of the present invention is to provide a protecting device of a memory module comprises two protecting sheets capable of covering a memory. Each upper edge of the protecting sheet has a buckling sheet and a buckling seat. One buckling sheet of one protecting sheet is capable of being buckled to the buckling seat of another protecting sheet. A front edge of each buckling seat is lowered so as to form an upper section surface and a lower section surface. The buckling hole has a lower buckling hole in the lower section surface and an upper buckling hole at the upper section surface. A front edge of the buckling sheet is lowered so as to form an upper section surface and a lower section surface. The lower section surface of the buckling sheet is formed with a buckling piece; and the buckling piece is extended with at least one tenon.

Another object of the present invention is to provide a protecting device of a memory module, wherein U shape clips are installed at one side of each protecting sheet.

Each clip has two legs which serves to clamp the protecting sheet; the protecting sheet is formed with recesses having shapes corresponding to the clips for confining the movement of the clips not to shake after assembly.

A buckling structure is formed in the recess for buckling the clips; a nose is punched from each recess of the protecting sheet, each clip is punched with a groove.

Each of two sides of the clip is formed with a notch; the recess of the protecting sheet is formed with a block corresponding to the notch for enhancing the strength of the structure.

A middle section of one edge of the U shape clip is formed with a protruded step portion; the step portion is formed with a gap with a lower edge of the recess.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
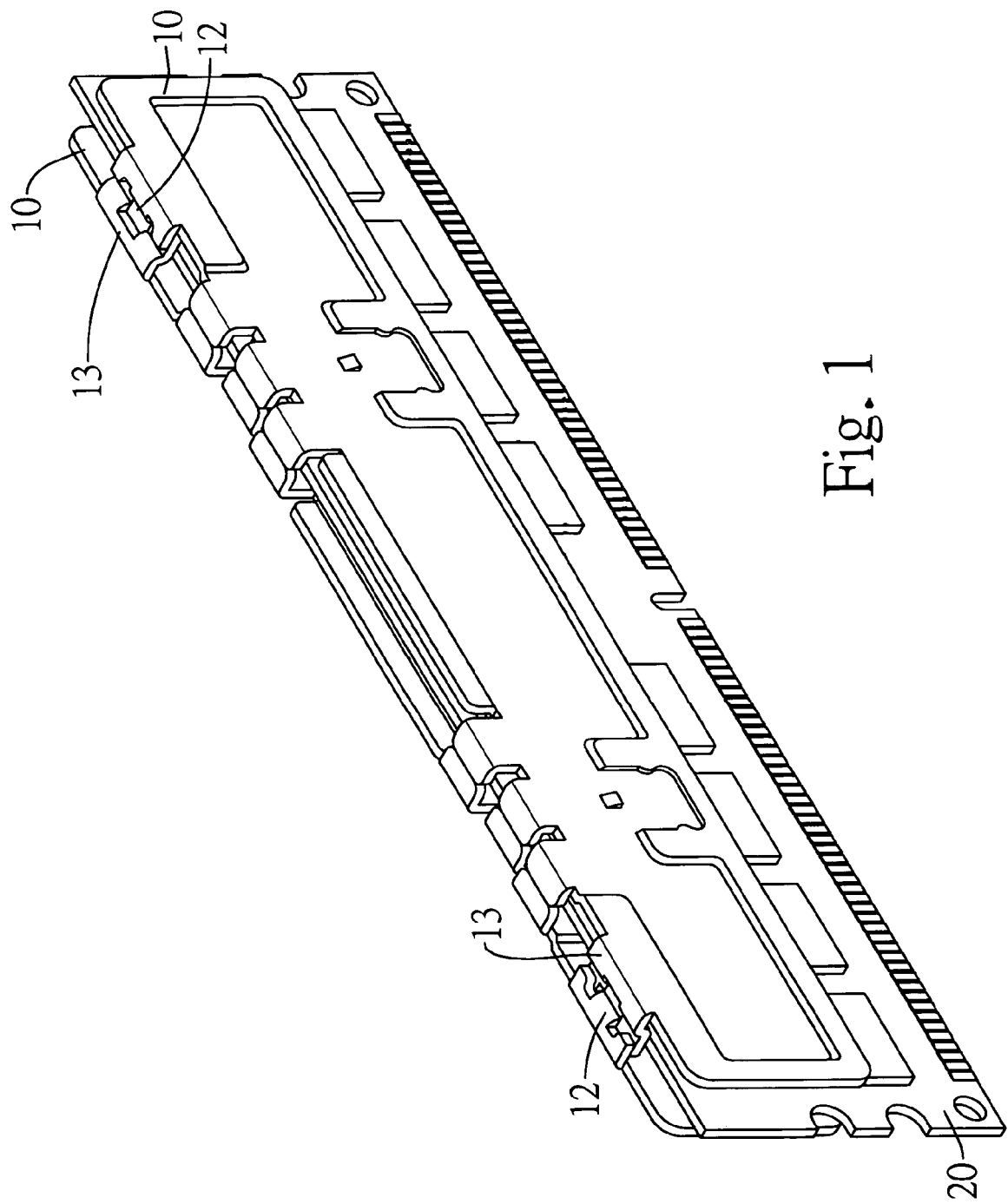
FIG. 1 is a perspective view of the first embodiment of the present invention.
Figure 2:
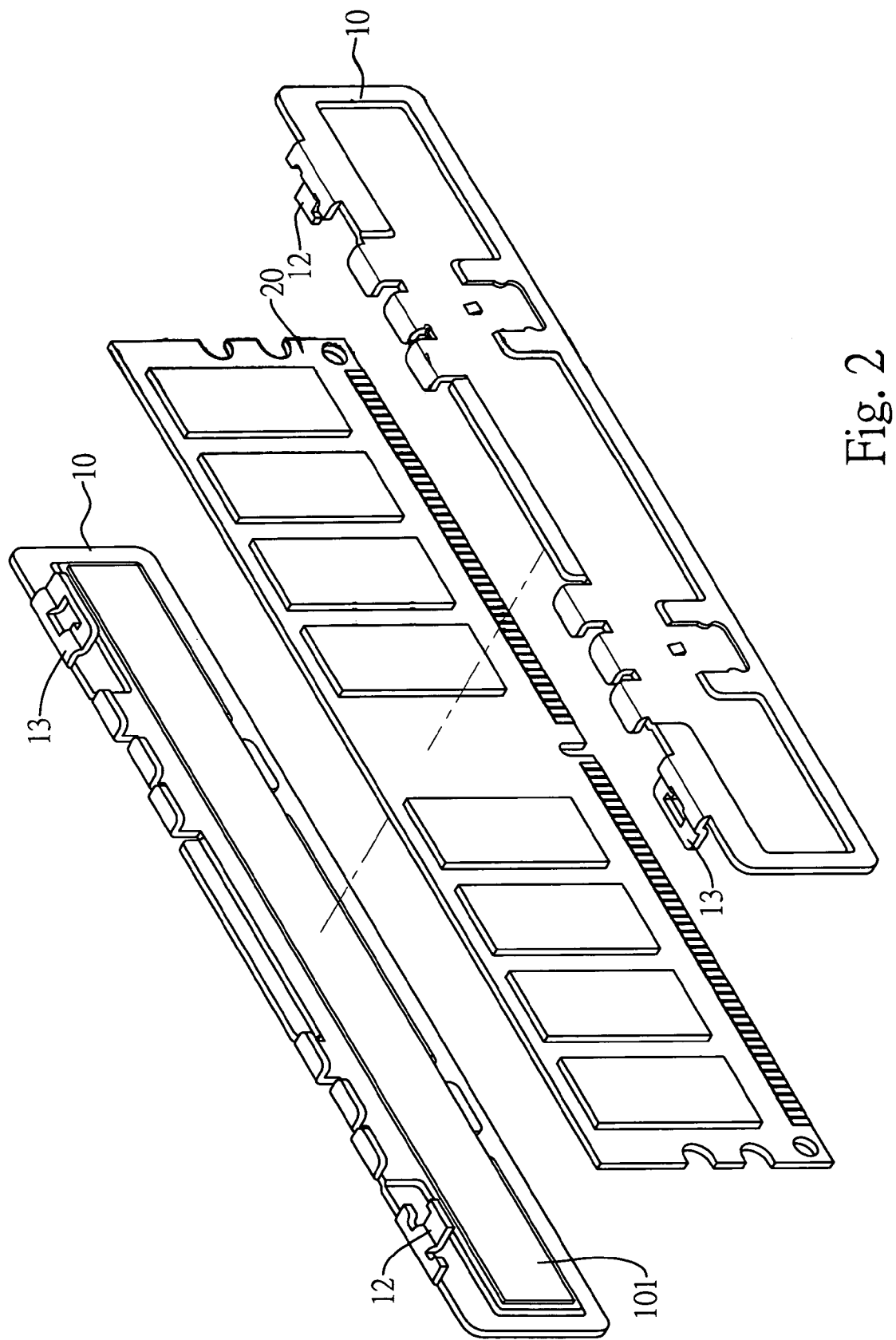
FIG. 2 is an exploded view of the embodiment illustrated in FIG. 1.

Referring to FIGS. 1 and 2, the protecting device of a memory module of the present invention is illustrated. The protecting device had the following elements.

Two protecting sheets 10 are capable of covering a memory 20. An inner side of each protecting sheet 10 has a film 101. Two films of the two protecting sheets 10 serve to clamp the memory 20 therein for protecting the chip of the memory 20.

Each upper edge of the protecting sheet 10 has a buckling sheet 12 and a buckling seat 13. One buckling sheet 12 of one protecting sheet 10 is capable of being buckled to the buckling seat 13 of another protecting sheet 10.

Figure 3:
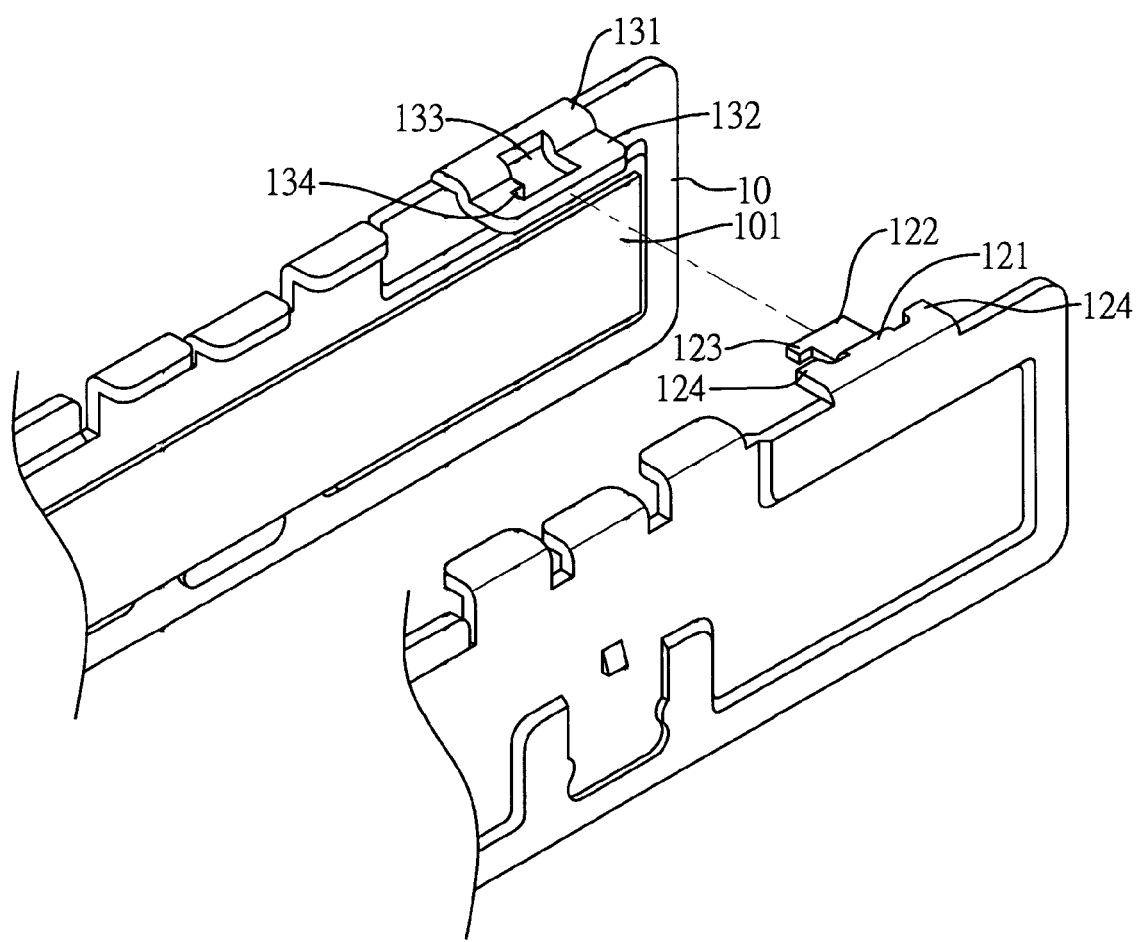
FIG. 3 is a partial enlarged view of the embodiment illustrated in FIG. 1.

Referring to FIG. 3, it is illustrated that a front edge of each buckling seat 13 is lowered so as to form an upper section surface 131 and a lower section surface 132. A buckling hole is formed in the buckling seat 13. The buckling hole has a U shape buckling hole 134 in the lower section surface 132 and a buckling hole 133 at the upper section surface 131 so as to form a two sectional buckling hole. The width of the U shape buckling hole 134 is wider than that of the buckling hole 133 of the upper section surface 131.

Figure 4A:
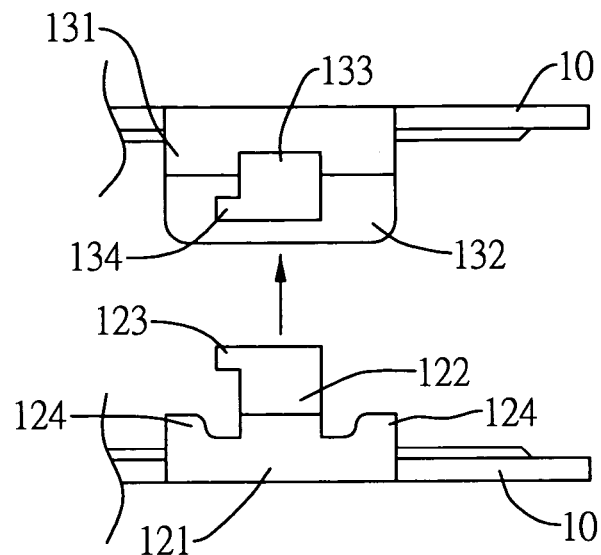
FIGS. 4A and 4B show the assembly of the buckling sheet and the buckling seat of the present invention.
Figure 4B:
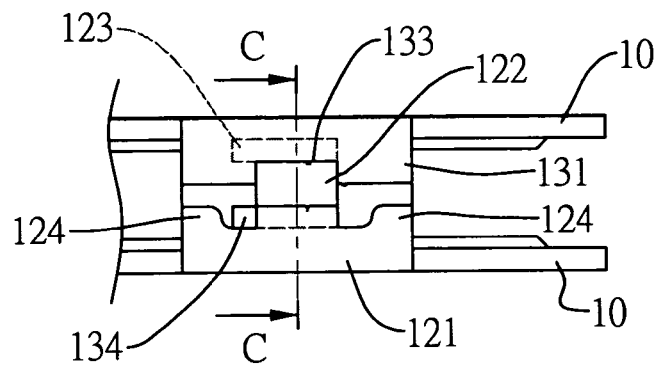
Figure 4C:
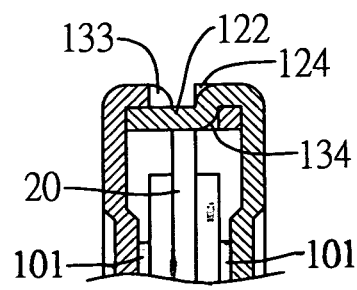
FIG. 4C is a cross section view along the line C—C of FIG. 4B.

Besides, a front edge of the buckling sheet 12 is lowered so as to form an upper section surface 121 and a lower section surface 122. The lower section surface 122 is formed with a buckling piece 122. An end portion of the buckling piece 122 is extended with a tenon 123 so that a width of the front edge of the buckling sheet 12 is approximately equal to a width of the U shape buckling hole 134 of the lower section surface 132, but larger than a width of the buckling hole 133 of the upper section surface 131. A portion of the buckling sheet 12 without the tenon 123 has a width smaller than a width of the buckling hole 133 of the upper section surface 131. By this way, referring to FIGS. 4A and 4B, when the two protecting sheets 10 are buckled, the buckling piece 122 and the tenon 123 are inserted into the U shape buckling hole 134 of the lower section surface 132 and resists against the buckling hole 133 of the upper section surface 131 of the buckling seat 13 with a smaller diameter. Thereby, it is difficult to slide out, as shown in FIGS. 4B and 4C.

Each side of two sides of the upper section surface 121 of the buckling sheet 12 has a resisting sheet 124. In assembly, the resisting sheet 124 resists against an upper side of the lower section surface 132 so as to steadily combine with the buckling piece 122 and thus three fulcrum is formed.

Figure 5:
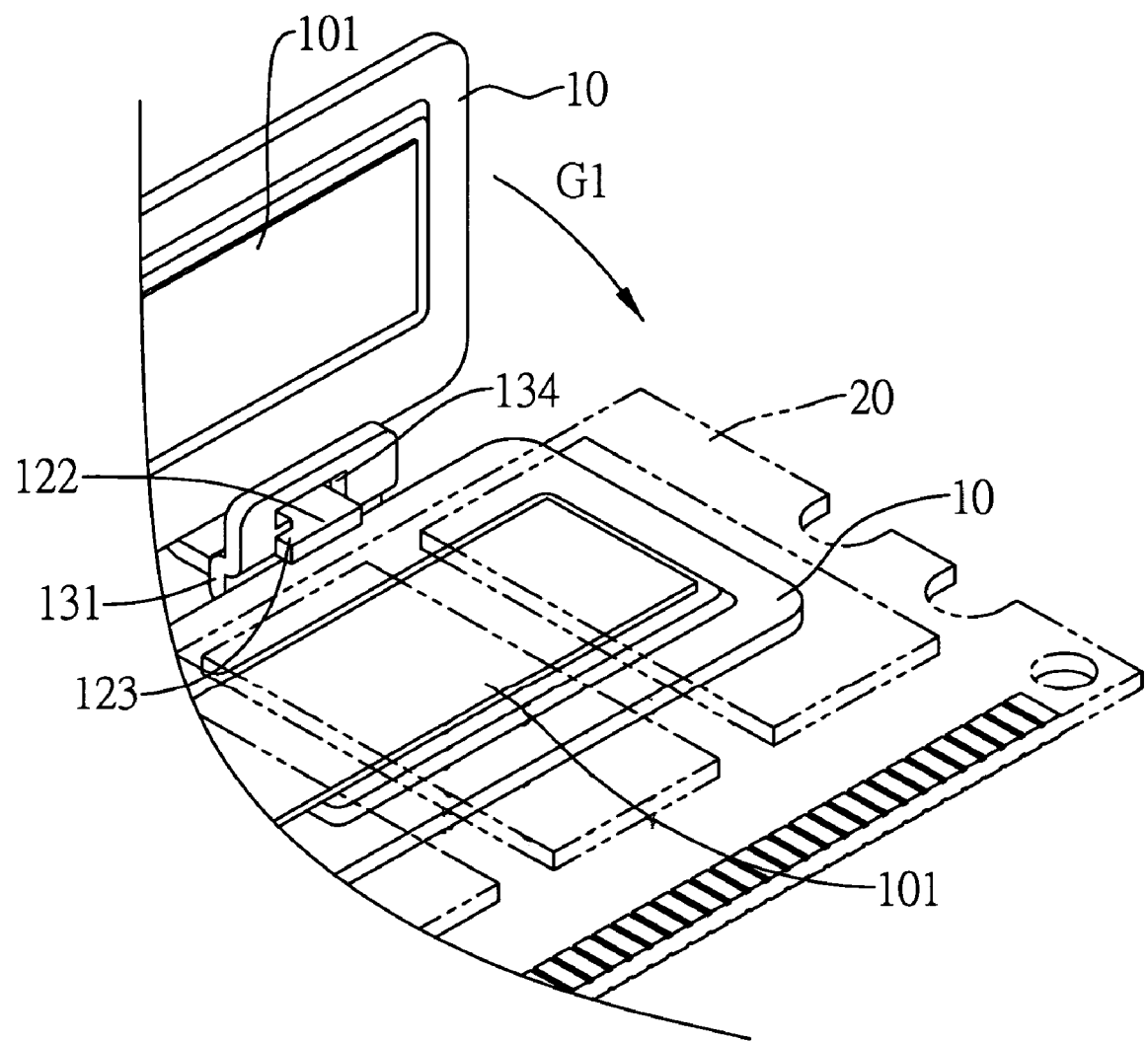
FIG. 5 is a schematic view showing the assembly of the memory of the present invention.

A front edge of the buckling piece 122 is installed with the tenon 123. Therefore, the two protecting sheets 10 are firmly secured to one another. In assembling with the memory 20, the two protecting sheets 10 are assembled in an expanded state, as shown in FIG. 5. Then, the memory 20 is adhered to the protecting sheets 10 which are horizontally arranged. Then the protecting sheets 10 are covered along the direction shown by arrow G1. Since the tenon 123 provides as a positioning rotary shaft so that the expanded protecting sheets 10 are accurately adhered to the upper side of the memory 20. Obviously, by the tenon 123 of the present invention, the protecting sheets 10 will not fall down. Thus the assembly work can be achieved rapidly. The manufacturing efficiency is increased and the cost is lowered.

Especially, by this design, the assembly of the memory can be aligned easily. The problem of wrong adhesion so that the memory must be torn away is resolved. Thereby, the probability of destroying the memory is decreased.

In above embodiment, the tenon 123 is only arranged at one side of the buckling piece 122. However, the tenon 123 can be installed at a left side or a right side or the two sides are installed with tenons.

Figure 6A:
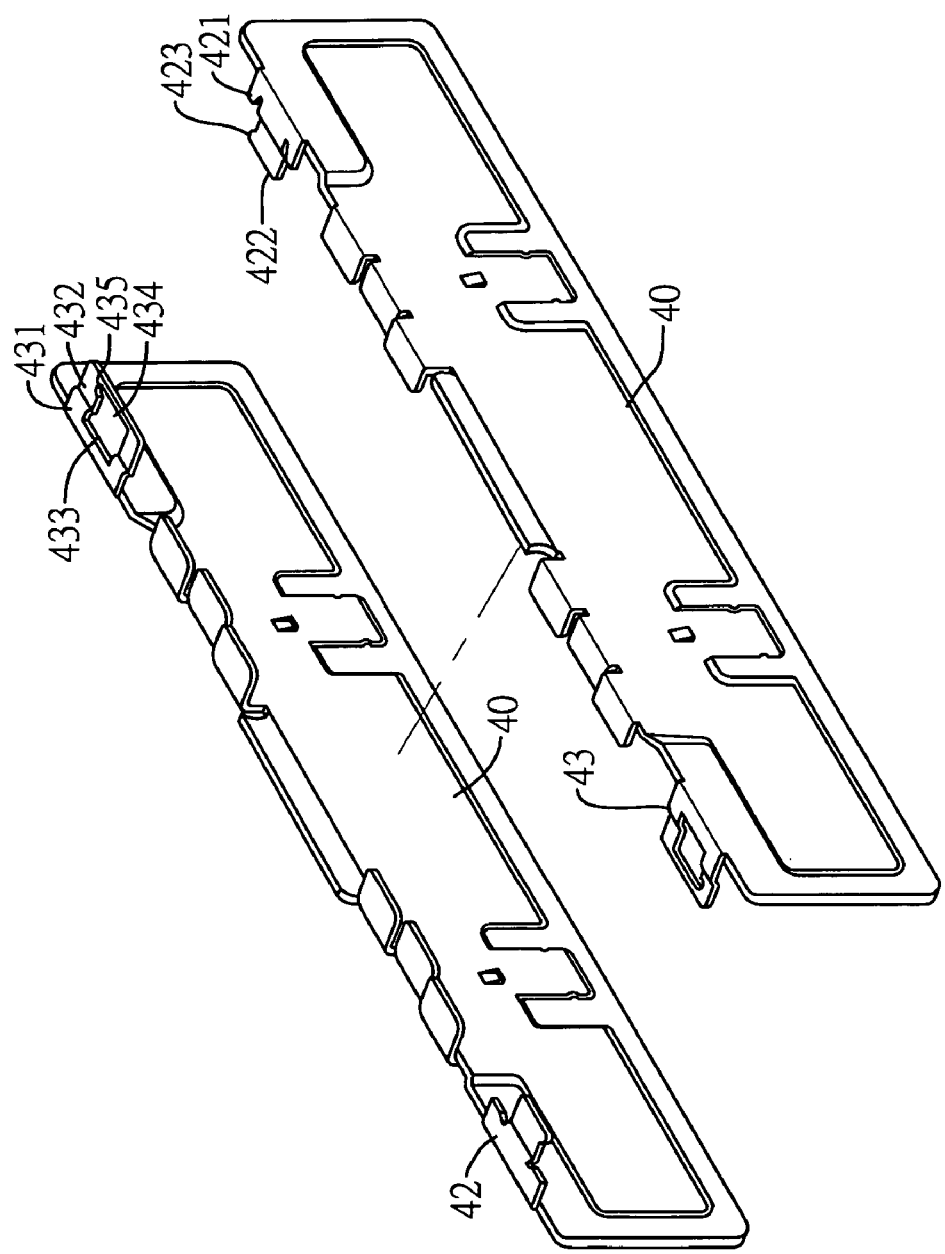
FIGS. 6A to 6D show another embodiment of the present invention.

Referring to FIG. 6A, another embodiment of the present invention is illustrated. Each protecting sheet 40 has a buckling sheet 42 and a buckling seat 43. The buckling seat 43 has an upper section surface 431 and a lower section surface 432. The buckling hole includes a buckling hole 433 of the upper section surface and a buckling hole 434 of the lower section surface. The buckling hole 434 of the lower section surface is wider than the buckling hole 433 of the upper section surface. Only a semi-round hole 435 is formed at one side. A diameter of the semi-round hole 435 is slightly larger than the thickness of the buckling sheet 42. Furthermore, a front edge of the buckling sheet 42 is descended so as to form with a lower section surface 421 and an upper section surface 422. The lower section surface 422 is formed as a buckling piece 422. A tenon 423 is extended from one side of the buckling piece 422. The tenon 423 has a semi-round shape. By this design, the semi-round hole 435 of the buckling hole 434 of the lower section surface is reduced so that when the tenon 433 is buckled into the buckling hole, it is difficult to slide out.

Figure 6B:
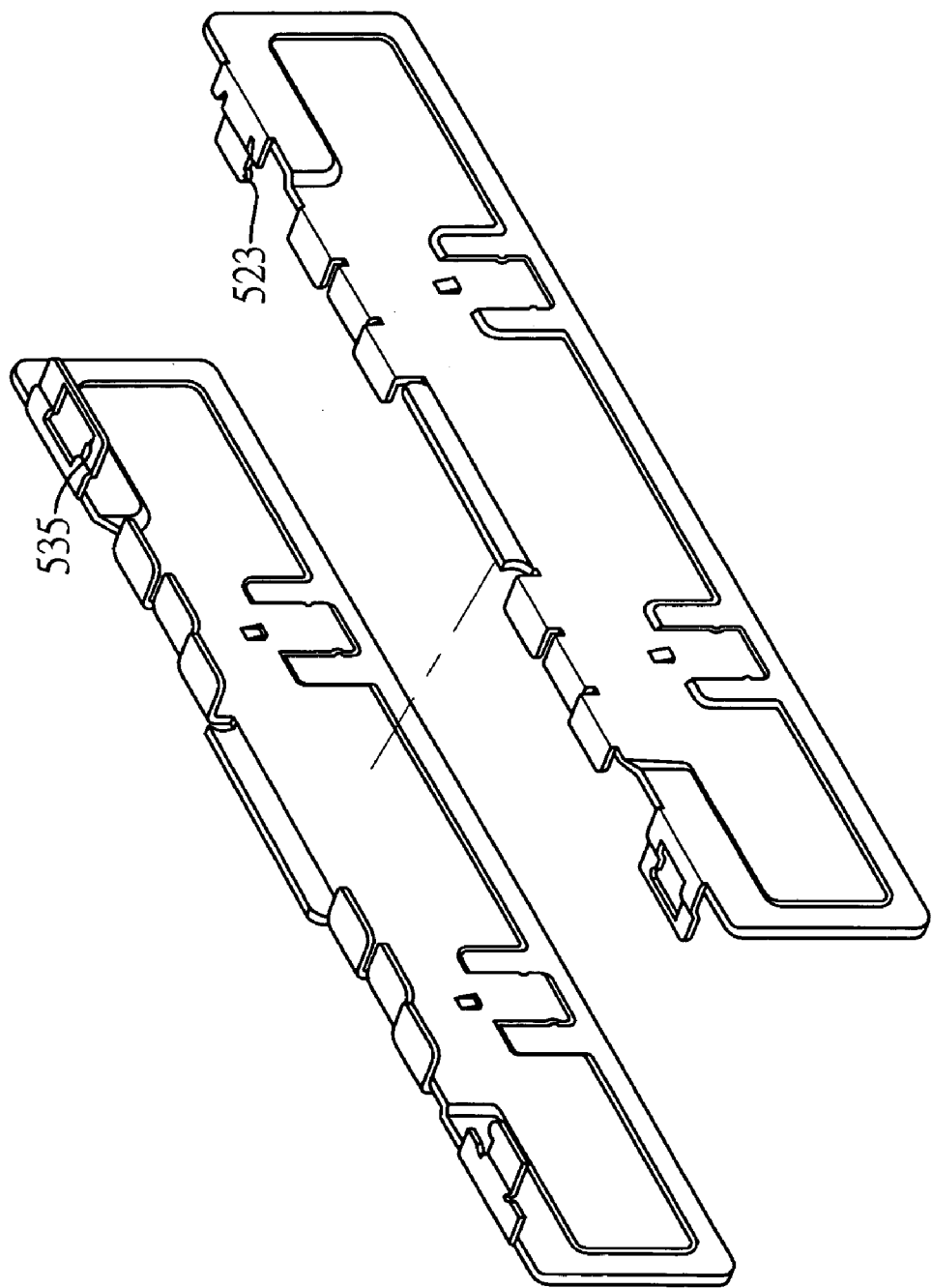

With reference to FIG. 6B, another embodiment of the present invention is illustrated. This embodiment is identical to that in FIG. 6A, but the semi-round hole 535 and the tenon 523 are installed at another side.

Figure 6C:
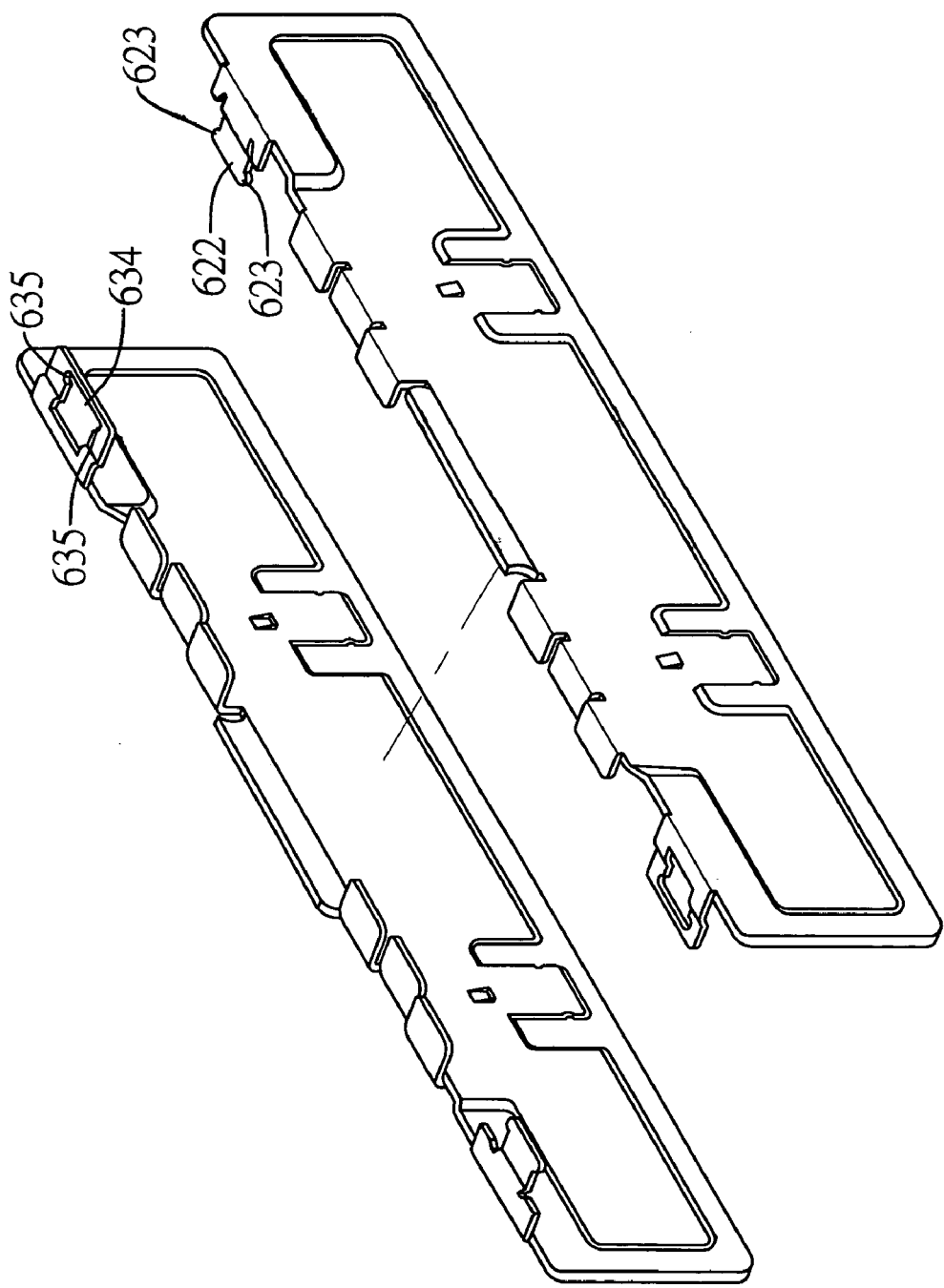

With reference to FIG. 6C, in this embodiment, other than those parts illustrated in above embodiments, two sides of the buckling piece 622 are installed with tenons 623. Thereby, the two sides of the buckling hole 634 of the lower section surface are formed with semi-round holes 635. Thereby, the buckling piece 622 is easily guided into the buckling hole 634 of the lower section surface. Since the tenons 623 are installed at two sides, the protecting sheets 10 are firmly buckled.

Figure 6D:
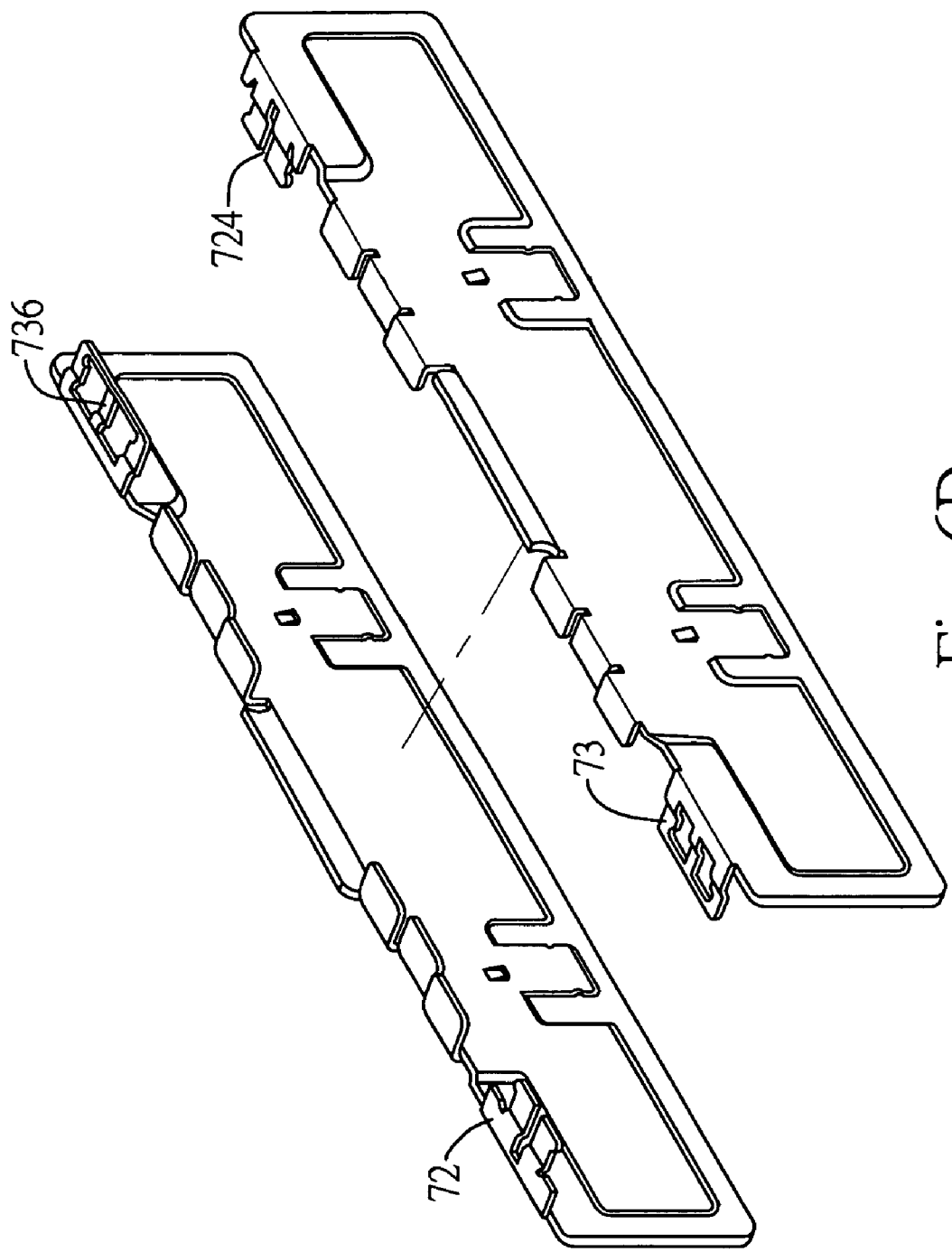

With reference to FIG. 6D, in this embodiment, other than those parts illustrated in above embodiments illustrated in FIG. 6C, a slot 724 is installed in the buckling sheet 72. A guide sheet 736 with a width slightly smaller than that of the slot 724 is formed in the buckling hole of the buckling seat 724. Thereby, the buckling sheet 72 is guided to the buckling hole.

In the present invention, the protecting sheets 10 serve to protect the chip of the memory 20 for preventing from collision or cracking. In one embodiment, the protecting sheets 10 are made of metal material and the film 101 is made of heat conductive material. Then, the present invention has the effect of protecting chip and heat dissipation.

Figure 7:
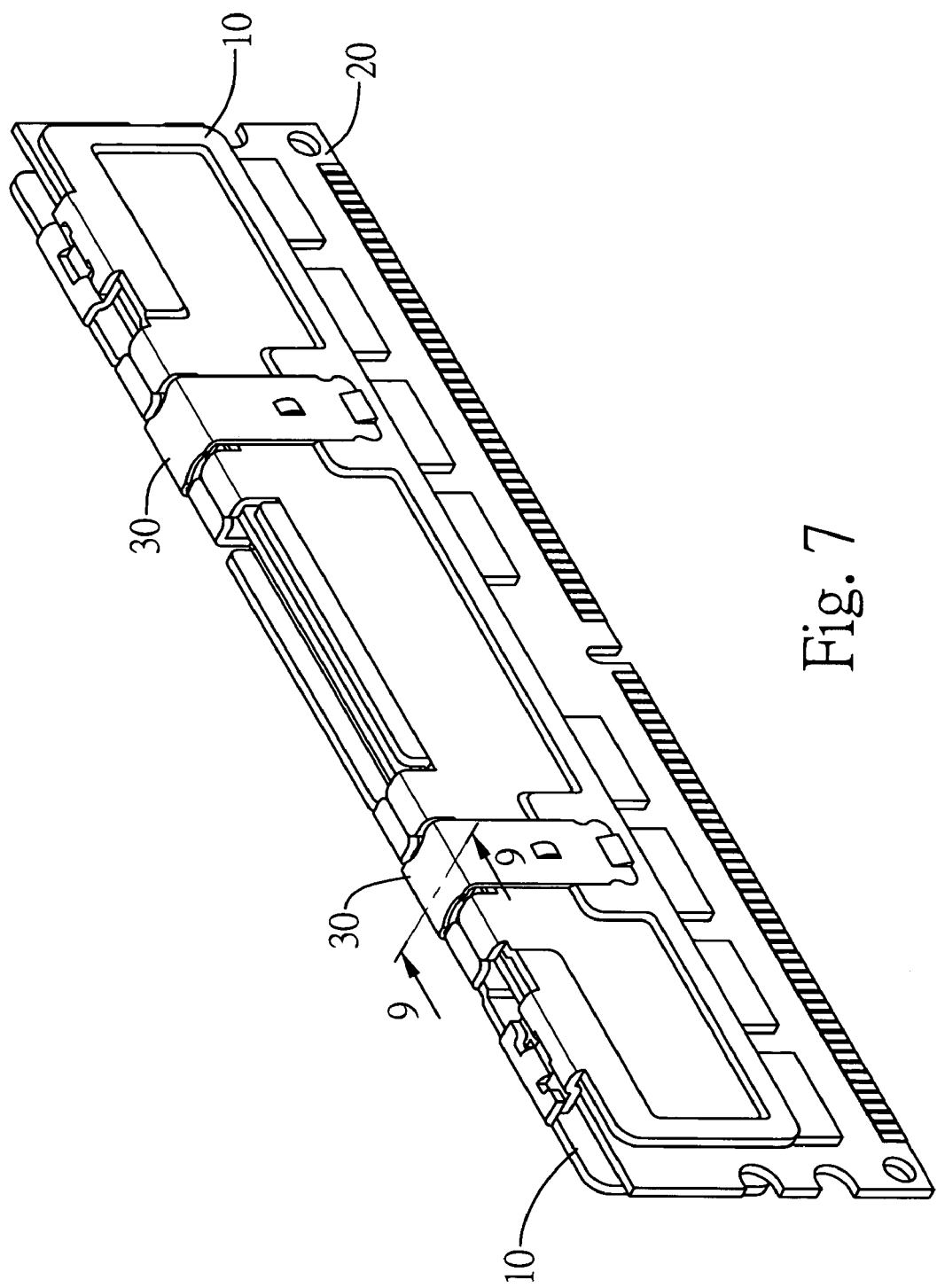
FIG. 7 is a perspective view of a further embodiment of the present invention, wherein a U shape clip is installed.
Figure 8:
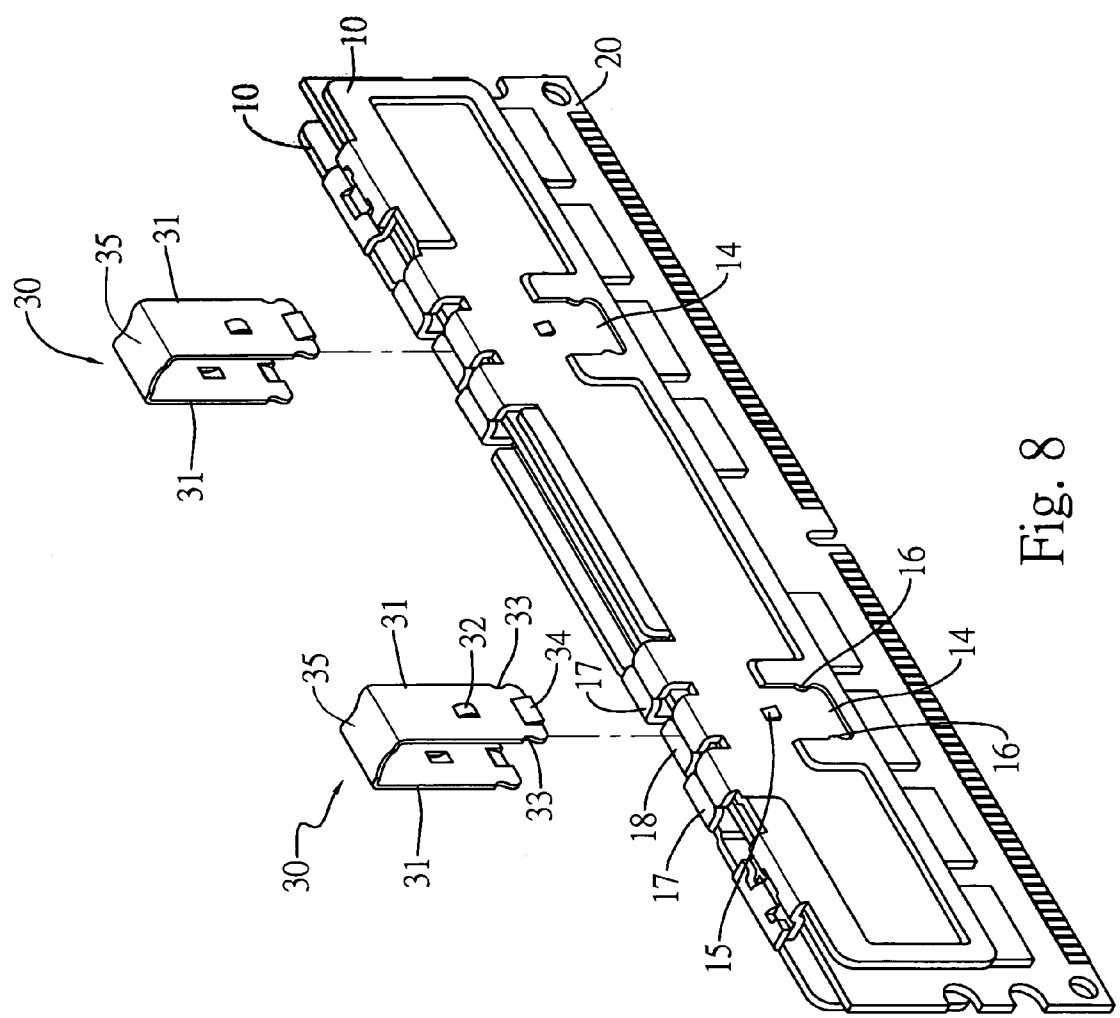
FIG. 8 is an exploded perspective view of the embodiment illustrated in FIG. 7.

Referring to FIGS. 7 and 8, U shape clips 30 are installed at one side of the protecting sheet 10. Each clip 30 has two legs 31 which serve to clamp the protecting sheet 10. The protecting sheet 10 is formed with recesses 14 having shapes corresponding to the clips 30 for confining the movement of the clips 30 not to shake after assembly. A buckling structure is formed in the recess 14 for buckling the clips 30.

With reference to FIG. 8, a nose 15 is punched from each recess 14 of the protecting sheet 10, each clip 31 is punched with a groove 32. The nose 15 has a slope for guiding the clip 30 and is used to buckle with the groove 32.

Furthermore, in the present invention, each of two sides of the clip 31 is formed with a notch 33. The recess 14 of the protecting sheet 10 is formed with a block 15 corresponding to the notch 33 for enhancing the strength of the structure.

Figure 9:
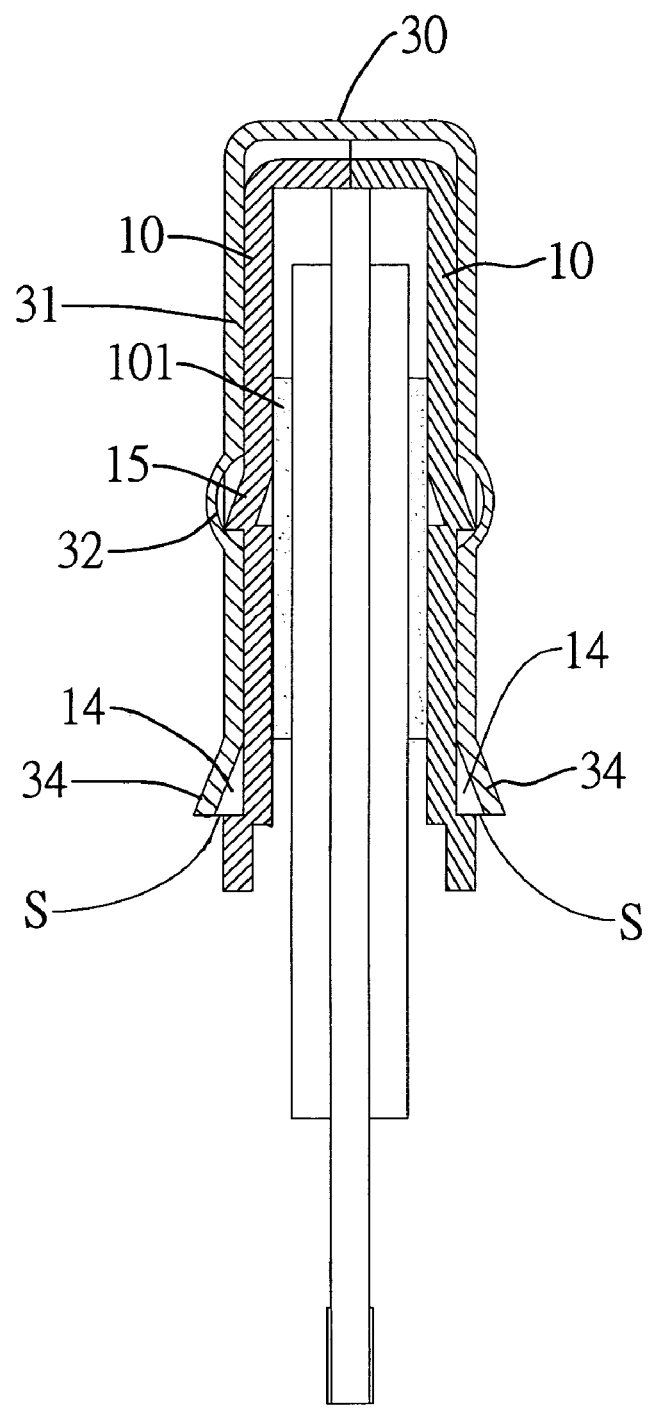
FIG. 9 is an enlarged cross section view along line 9—9 of FIG. 7.

Besides, for opening the U shape clip 30 after buckling, a middle section of one edge of the U shape clip 31 is formed with a protruded step portion 34, see FIG. 9. The step portion 34 is formed with a gap S with a lower edge of the recess 14 for receiving a flat object, such as an opening to release the U shape clips 30 and the protecting sheets 10. Thereby, the protecting device is detached.

An upper edge of the protecting sheet 10 has two positioning sheets 18. Two supporting seats 17 are placed beside one protecting sheets 10. A connection portion 35 of the two legs 31 of one U shape clip 30 are placed upon the positioning sheet 18 for confining the U shape clip 30.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A protecting device of a memory module comprising:
two protecting sheets covering a memory; an inner side of each protecting sheet having a film; two films of the two protecting sheets serving to clamp the memory therein for protecting the chip of the memory;

each upper edge of the protecting sheet having a buckling sheet and a buckling seat; one buckling sheet of one protecting sheet being buckled to the buckling seat of another protecting sheet;

wherein a front edge of each buckling seat is lowered so as to formed an upper section surface and a lower section surface; a buckling hole being formed in the buckling seat; the buckling hole has a lower buckling hole in the lower section surface and an upper buckling hole at the upper section surface so as to form a two sectional buckling hole; the width of the lower buckling hole is wider than that of the upper buckling hole of the upper section surface; a front edge of the buckling sheet is lowered so as to form an upper section surface and a lower section surface; the lower section surface of the buckling sheet is formed with a buckling piece; an end portion of the buckling piece is extended with at least one tenon, and a width of the front edge of the buckling sheet is approximately equal to a width of the shape buckling hole of the lower section surface, but larger than a width of the buckling hole of the upper section surface; a portion of the buckling sheet without the tenon has a width smaller than a width of the buckling hole of the upper section surface; thus, when the two protecting sheets are buckled, the buckling piece and the tenon are inserted into the buckling hole of the lower section surface; and wherein the protecting sheets are made of heat conductive material so as to have a function of heat dissipation.

2. The protecting device of a memory module as claimed in claim 1, wherein the upper buckling hole at the upper section surface is a semi-round hole a diameter of the semi-round hole is slightly larger than the thickness of the buckling sheet.

3. The protecting device of a memory module. as claimed in claim 1, wherein the tenon has a shape selected from one of a semi-round shape or a U shape.

4. The protecting device of a memory module, as claimed in claim 3, wherein each of two lateral sides of the buckling sheet are extended with a respective tenon; and each of two sides of the buckling hole of the lower section surface is formed with a semi-round hole.

5. The protecting device of a memory module, as claimed in claim 4, wherein the buckling sheet is formed with a slot and the buckling hole of the buckling seat has a guide piece, and a width of the guide piece is slightly smaller than a width of the slot.

6. The protecting device of a memory module as claimed in claim 1, wherein U shape clips are installed at one side of each protecting sheet.

7. The protecting device of a memory module as claimed in claim 6, wherein each clip has two legs which serve to clamp the protecting sheet; the protecting sheet is formed with recesses having shapes corresponding to the clips for confining the movement of the clips so as not to shake after assembly.

8. The protecting device of a memory module as claimed in claim 7, wherein a buckling structure is formed in the recess for buckling the clips; a nose is punched from each recess of the protecting sheet, and each clip is punched with a groove.

9. The protecting device of a memory module as claimed in claim 6, wherein each of two sides of the clip is formed with a notch; the recess of the protecting sheet is formed with a block corresponding to the notch for enhancing the strength of the structure.

10. The protecting device of a memory module as claimed in claim 9, wherein a middle section of one edge of the U shape clip is formed with a protruded step portion; the step portion is formed with a gap with a lower edge of the recess.

* * * * *